March 25, 1958 J. H. MYER 2,828,232
METHOD FOR PRODUCING JUNCTIONS
IN SEMI-CONDUCTOR DEVICE
Filed May 1, 1956 2 Sheets-Sheet 1

JON H. MYER,
INVENTOR
BY
ATTORNEY

March 25, 1958
J. H. MYER
METHOD FOR PRODUCING JUNCTIONS
IN SEMI-CONDUCTOR DEVICE
2,828,232
Filed May 1, 1956
2 Sheets-Sheet 2
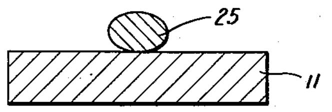
Fig. 7.
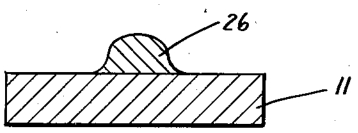
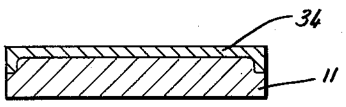
Fig. 8
Fig. 10.
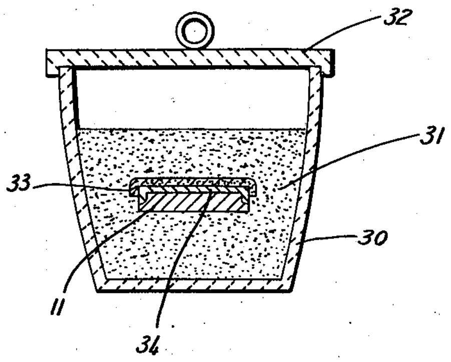
Fig. 9.
JON H. MYER,
INVENTOR
BY [signature]
ATTORNEY

United States Patent Office 2,828,232

Patented Mar. 25, 1958

2,828,232

METHOD FOR PRODUCING JUNCTIONS IN SEMI-CONDUCTOR DEVICE

Jon H. Myer, Culver City, Calif., assignor to Hughes Aircraft Company, Culver City, Calif., a corporation of Delaware Application May 1, 1956, Serial No. 581,941

16 Claims. (Cl. 148—1.5)

This invention relates to fused junction semiconductor devices and more particularly to new methods for producing the same.

In the semiconductor art, a region of semiconductor material containing an excess of donor impurities and having an excess of free electrons is considered to be an N-type region, while a P-type region is one containing an excess of acceptor impurities resulting in a deficit of electrons or, stated differently, an excess of holes. When a continuous solid specimen of semiconductor material has an N-type region adjacent a P-type region the boundary between them is termed a P–N (or N–P) junction, and the specimen of semiconductor material is termed a P–N junction semiconductor device. Such a P–N junction device may be used as a rectifier, photocell, transistor, or the like. A specimen having two N-type regions separated by a P-type region, for example, is termed an N–P–N junction semiconductor device or transistor, while a specimen having two P-type regions separated by an N-type region is termed a P–N–P junction semiconductor device or transistor.

These P–N or N–P junctions are hereinafter referred to as rectifying junctions or simply as junctions. It often is desirable to provide a non-rectifying junction or ohmic contact to a semiconductor device. The method of the present invention is peculiarly adapted to the production of both rectifying and non-rectifying junctions by the phenomenon of diffusion of active impurity atoms into the semiconductor starting crystal. When a P-type starting crystal of a given resistivity, for example, has diffused therein, acceptor atoms, a diffused P-type region of a different resistivity is produced. The interface between these two regions is what has been herein termed a non-rectifying junction or ohmic contact. The term junction, therefore, for the purpose of this invention is intended to include both rectifying and non-rectifying junctions.

The term semiconductor material as utilized herein is considered generic to both germanium and silicon, and is employed to distinguish these semiconductors from metallic oxide semiconductors such as copper oxide and other semiconductors consisting essentially of chemical compounds.

The term "active impurity" is used to denote both impurities which affect the electrical rectification characteristics of semiconductor material as distinguished from other impurities which have no appreciable effect upon these characteristics. Active impurities are ordinarily classified as donor impurities such as, phosphorus, arsenic, and antimony, or acceptor impurities such as boron, aluminum, gallium, and indium.

In the prior art P–N junction semiconductor devices have been produced by fusing small amounts of a low melting-point acceptor impurity with portions of a semiconductor starting specimen. According to this prior method, a predetermined amount of low melting-point acceptor impurity such as indium, for example, is placed in contact with the surface of an N-type germanium specimen. The specimen and the contacting indium are then heated to a temperature above the melting point of the indium, but below the melting point of the germanium specimen in order to melt the indium and dissolve therein a portion of the adjacent germanium. The specimen is then cooled so that the dissolved atoms of germanium and indium are regrown onto the specimen thereby producing an indium-saturated P-type region in the semiconductor specimen.

It has been recognized in the semiconductor art for sometime that silicon has many physical advantages over germanium, in particular its ability to withstand relatively high operating temperatures. Nevertheless, fused-junction silicon diodes or transistors have been difficult to produce heretofore owing to the fact that the production techniques which have been found suitable for producing fused-junction germanium devices are not adaptable to the production of fused-junction silicon devices. More particularly, the production of fused-junction silicon devices has been complicated by several basic factors. First, it is difficult to make a good ohmic electrical connection to silicon. The more conventional techniques employed for connecting to germanium have been found to produce with silicon relatively high impedance connections which in many instances are asymmetrically conductive. Second, the inherent tendency of silicon toward rapid formation of extremely hard and stable oxide has rendered it difficult to create fused-junction silicon devices because of the inability of the active impurity employed in the fusion process to wet the adjacent surface of the silicon. Accordingly, in the hereinabove described methods for producing a fused junction in a semiconductor starting crystal, and more particularly in a silicon semiconductor starting crystal, it is typically required that a non-oxidizing or inert atmosphere be provided in the immediate vicinity of the junction area.

Another disadvantage inherent in the method above referred to is that only relative small area junctions may so be produced.

The present invention overcomes the above and other difficulties which have heretofore limited the use of silicon and often germanium and provides diffused-junction silicon and germanium semiconductor devices which have exceptional electrical characteristics.

According to the basic concept of the present invention methods are disclosed for producing a non-rectifying low-impedance electrical connection to a silicon or germanium starting specimen and also for creating rectifying junctions within the specimen by fusing thereto a salt containing an active impurity which is capable of readily wetting silicon or germanium and act as a source of the active impurity to be diffused into the specimen.

More particularly, according to a preferred embodiment of the invention a diffused junction silicon device is produced by immersing a silicon starting wafer of N-type conductivity in a salt containing as one of its elements an acceptor impurity such as boron, and heating the crystal-salt combination to a temperature above the melting point of the salt, but below the melting point of the crystal and below the decomposition temperature of said salt. In addition the present invention provides methods for creating an ohmic contact to a P-type semiconductor starting crystal.

Accordingly, it is an object of the present invention to provide a new method for producing large-area junction semiconductor devices.

A further object of the present invention is to provide a method for diffusing an active impurity into a semiconductor starting crystal without the necessity of using an inert ambient.

A still further object of the invention is to provide a method for simultaneously producing two junctions in a semiconductor starting crystal.

Yet another object of this invention is to provide a method for producing an ohmic contact to a silicon semiconductor starting crystal by fusing thereto a salt containing an active impurity in an inert ambient.

The novel features which are believed to be characteristic of the present invention, both as to its organization and method of operation, together with other objects and advantages thereof, will be better understood from the following description considered in connection with the accompanying drawings in which several embodiments of the invention are illustrated by way of example. It is to be expressly understood, however, that the drawings are for the purpose of illustration and description only, and are not intended as a definition of the limits of the invention.

In the drawings:

Fig. 7 is a sectional view of the wafer of Fig. 1 with a pellet of salt placed thereupon as the first step in a third method according to the present invention;

Fig. 8 is a sectional view showing the salt pellet and crystal of Fig. 7 in a subsequent stage of production;

Fig. 9 is a diagrammatic view of the Fig. 8 combination in a still later stage of production; and Fig. 10 is a sectional view illustrating the wafer in its final stage of production, subsequent to the etching step.

Figure 1:
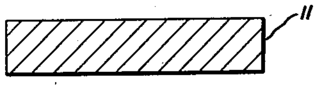
Fig. 1 is a sectional view of a semiconductor wafer which is to be processed according to the method of the present invention.
Figures 2, 3, 4, 6:
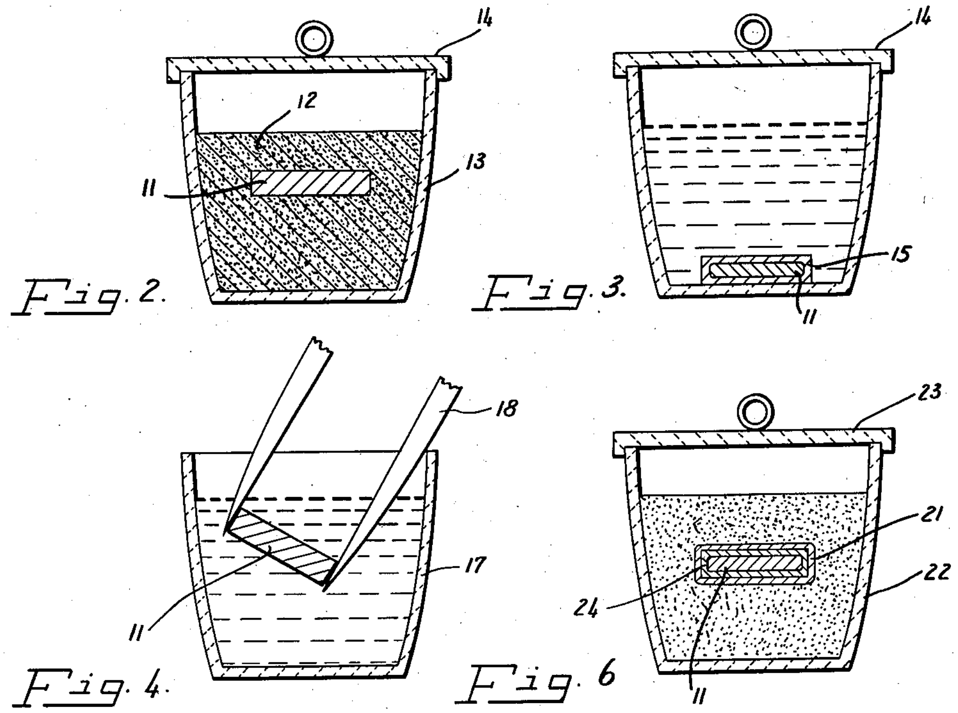
Fig. 2 is a cross-sectional view showing the wafer of Fig. 1 immersed in a crucible filled with a salt containing an active impurity as one of its elements.
Fig. 3 is a cross-sectional view of the crucible and wafer of Fig. 2 after the diffusion process has taken place.
Fig. 4 is a diagrammatic view showing how the crystal might be placed in a crucible according to another method of the present invention.
Fig. 6 is a sectional view of the wafer of Fig. 5 in a still later stage of production after prolonged baking at elevated temperature in an inert powder ambient.

Referring now to the drawings, there is shown in Fig. 1 semiconductor crystal wafer 11 which may be either of N- or P-type germanium or silicon. For the purposes of clarity and simplicity of explanation it will hereinafter be assumed that the semiconductor starting crystal 11 is of P-type conductivity silicon. Crystal 11 according to one embodiment of the present invention is placed or immersed in a salt 12 which is in the anhydrous form, which salt has previously been placed into crucible 13 as illustrated in Fig. 2. Thereafter cover 14 is placed over the top of crucible 13. Finally the crucible is heated to a temperature above the melting point of the salt which may, for example, be anhydrous sodium tetraborate, but below its decomposition temperature and below the melting point of the silicon. As the salt melts the crystal 11 will have a tendency to slowly sink to the bottom of the crucible 13 as shown in Fig. 13. During the period of time that the crucible is being heated by a source of heat not shown, the boron atoms contained in the sodium tetraborate salt will have a tendency to diffuse into the crystal 11 producing an impurity-doped P-type region along the outer periphery of the crystal 11 designated herein as 15. After the diffusion process has taken place in a controlled manner hereinafter to be discussed with respect to the specific example of anhydrous sodium tetraborate, the crystal wafer is removed from the crucible and may then be etched by any method known to the art. After the ends have been spliced parallel to the small sides a P–N–P device is obtained which may be readily adapted as a transistor.

Referring now to Fig. 4, there is shown the crystal wafer 11 being placed into crucible 17 by tweezers 18, the crucible being shown without a lid. As in the embodiment of Fig. 3 the crucible in Fig. 4 is filled with a molten anhydrous salt containing an acceptor impurity.

Figure 5:
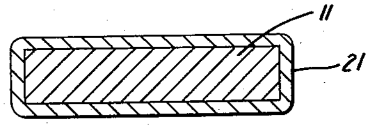
Fig. 5 is a cross-sectional view of the wafer as it appears after withdrawal from the crucible of Fig. 4.

The crystal 11 is only permitted to remain in the crucible long enough to permit a coating 21 of salt to form about it as best seen in Fig. 5.

After the desired amount or thickness of coating is produced the crystal 11 is removed from the molten salt and is placed into crucible 22 shown in Fig. 6. Crucible 22, instead of being filled with a salt, contains an inert ambient substance such as carbon dust. Crucible 22 is then covered with cover 23 and raised to a temperature, by a source of heat not shown, above the melting point of the salt, but below the melting point of the crystal and below the decomposition temperature of the salt. This latter precaution is practiced to permit more complete control of the process.

In this manner, diffusion takes place, and a converted P-type region 24 will be produced in wafer 11, thus resulting in a rectifying junction, or a P–N junction.

In Figs. 7 through 10 there are shown cross-sectional diagrammatic views illustrating how N-type starting wafer 11 might have produced therein a P-type region by an alternative method using a boron-salt again, for example. The wafer 11 has placed thereon a pre-fused chip of salt 25 which contains boron as the active impurity.

The chip-wafer combination is then heated in an inert gaseous atmosphere to reduce the likelihood of the formation of an oxide film on the surface of the wafer 11 until it begins to run as shown in Fig. 8 at 26.

The Fig. 8 wafer-salt combination is then placed into crucible 30 shown in Fig. 9 which crucible is filled with inert ambient powder 31 such as carbon dust. Cover 32 is then placed over crucible 30 and the crucible is heated to a temperature above the melting point of the salt, but below the melting point of the crystal 11, and below the decomposition point of the salt. The molten salt will then run over the surface of the crystal 11 and assume a configuration as shown in Fig. 9 at 33. With the continued application of heat boron atoms from the anhydrous sodium tetraborate salt will diffuse into crystal 11 and produce acceptor-doped P-type region 34. After the diffusion step is completed the crucible 30 is allowed to cool and the wafer 11 is removed. Then the salt formed at 33 upon the surface of crystal 11 may be removed by any method known to the art such as etching.

The method of the present invention has been described with N-type silicon as the starting wafer and anhydrous sodium tetraborate as the acceptor impurity source from which boron atoms are diffused into the N-type silicon to convert a region thereof to P-type resulting in a P–N junction at the interface. It is of course obvious to one skilled in the art that the starting crystal could very well be germanium and could also alternatively be of N-type conductivity.

Further, a salt containing an N-type active impurity such as antimony trioxide might be used in place of the sodium tetraborate to produce an N-type region in either a P- or N-type conductivity starting crystal.

Mixing of an inert salt or salts with the impurity-source salt is an added feature of the method of the present invention, thus permitting the impurity concentration of the salt to be reduced. This permits even greater control over the diffusion process.

Examples of acceptor impurity containing salts which have been successfully applied to the method herein described are sodium tetraborate which melts at 741° centigrade and decomposes at 1575° centigrade for P-type doping, and sodium pyrophosphate which melts at 880° centigrade for N-type doping. Another N-type doping salt is antimony trioxide which melts at 656° centigrade and boils at 1550° centigrade. Among some of the other possible salts that might be used for doping, are: indium fluoride (melting point 1170° centigrade), indium sesquisulfide (melting point 1050° centigrade), aluminum fluoride (melting point 1040° centigrade), aluminum sulfide (melting point 1100° centigrade), gallium sesquiselenide (melting point 1020° centigrade), and gallium sesquisulfide (melting point 1255° centigrade).

An alternative technique which may be used in the method of the present invention is to presaturate the salt with silicon (when silicon is the starting wafer) in order to preclude the possibility of the salt completely dissolving the silicon.

There has thus been disclosed a new method for producing rectifying and non-rectifying junctions in semiconductor materials by diffusion of active impurities therein under accurately controlled tolerances without need of a non-oxidizing atmosphere.

What is claimed as new is:

1. The method of producing a junction in a semiconductor starting crystal of a predetermined conductivity type by diffusing atoms of an active impurity into said crystal, said method including the steps of: bringing a salt having an active impurity as one of its elements into contact with a portion of a surface of the crystal; and heating the crystal-salt combination to a temperature above the melting point of the salt, but below the melting point of the crystal and below the decomposition temperature of the salt.

2. The method of producing a junction in a semiconductor starting crystal of a predetermined conductivity type by diffusing atoms of an active impurity into said crystal, said method including the steps of: surrounding the semiconductor starting crystal with a salt having an active impurity as one of its elements; and heating the crystal-salt combination to a temperature above the melting point of the salt, but below the melting point of the crystal and below the decomposition temperature of the salt.

3. The method of producing a junction in a semiconductor starting crystal of a predetermined conductivity type by diffusing atoms of an active impurity into said crystal, said method including the steps of: placing a salt having the active impurity as one of its elements into contact with a portion of a surface of the crystal; heating the crystal-salt combination to a temperature above the melting point of the salt, but below the decomposition temperature of the salt, and below the melting point of the crystal to melt the salt, maintaining said temperature until the molten salt spreads over a predetermined second portion of said surface of said crystal; immersing the crystal-salt combination into an inert ambient; and reheating the crystal-salt combination above the melting point of the salt, but below the melting point of the crystal and below the decomposition temperature of the salt.

4. The method of producing a junction in a semiconductor starting crystal of a predetermined conductivity by diffusing atoms of an active impurity into said crystal, said method including the steps of: placing a salt having the active impurity as one of its elements into contact with a portion of a surface of the crystal; placing the crystal-salt combination into an inert ambient; heating the crystal-salt combination to a temperature above the melting point of the salt, but below the decomposition temperature of the salt and below the melting point of the crystal to melt the salt, maintaining said temperature until the molten salt spreads over a predetermined second portion of said surface of said crystal; cooling the crystal-salt combination; immersing the crystal-salt combination into an inert ambient; and reheating the crystal-salt combination above the melting point of the salt, but below the melting point of the crystal and below the decomposition temperature of the salt.

5. The method of producing a junction in a semiconductor starting crystal of a predetermined conductivity type by diffusing atoms of an active impurity into said crystal, said method including the steps off: bringing a salt having the active impurity as one of its elements into contact with a portion of a surface of the crystal; and heating the crystal-salt combination of a predetermined period of time to a temperature above the melting point of the salt, but below the melting point of the crystal and below the decomposition temperature of the salt.

6. The method defined in claim 1 including the further step of removing the salt residue from the surface of the crystal-salt combination.

7. The method of producing a junction in a semiconductor crystal of a predetermined conductivity type by diffusing atoms of an active impurity into said crystal, said method including the steps off: bringing a salt into contact with a portion of a surface of the crystal, the salt comprising an inert salt and a salt having the active impurity as one of its elements; and heating the crystal-salt combination to a temperature above the melting point of the salt, but below the melting point of the crystal and below the decomposition temperature of the salt.

8. The method defined in claim 7 including the further step of removing the salt residue from the surface of the crystal-salt combination.

9. The method of producing a junction in a semiconductor starting crystal of a predetermined conductivity type by diffusing atoms of an active impurity into said crystal, said method including the steps of: bringing an anhydrous sodium tetraborate salt into contact with a portion of the surface of the crystal; and heating the crystal-salt combination to a temperature above the melting point of the salt, but below the melting point of the crystal and below the decomposition point of the salt for a period of time sufficient to permit atoms of boron from the salt to diffuse into the crystal.

10. The method of producing a junction in a semiconductor starting crystal of a predetermined conductivity type by diffusing atoms of an active impurity into said crystal, said method including the steps of: bringing a salt having an active impurity as one of its elements into contact with a portion of a surface of a silicon semiconductor crystal; and heating the crystal-salt combination to a temperature above the melting point of the salt, but below the melting point of the crystal and below the decomposition temperature of the salt.

11. The method defined in claim 1 wherein said semiconductor starting crystal is germanium.

12. The method of producing a junction in an N-type silicon semiconductor starting crystal by diffusing atoms of of acceptor impurity into said crystal, said method including the steps of: bringing the salt having the acceptor impurity as one of its elements into contact with a portion of the surface of the crystal; and heating the crystal-salt combination to a temperature above the melting point of the salt, but below the melting point of the crystal and below the decomposition temperature of the salt.

13. The method of producing a junction in an N-type germanium starting crystal of a predetermined conductivity type by diffusing atoms of an acceptor impurity into said crystal, said method including the steps of: bringing a salt having an acceptor impurity as one of its elements into contact with a portion of a surface of an N-type germanium crystal; and heating the crystal-salt combination to a temperature above the melting point of the salt, but below the melting point of the crystal and below the decomposition temperature of the salt.

14. The method of producing an ohmic contact in a P-type silicon semiconductor starting crystal by diffusing atoms of an acceptor impurity into said crystal, said method including the steps of: bringing a salt having the acceptor impurity as one of its elements into contact with a portion of a surface of the silicon crystal; and heating the crystal-salt combination to a temperature above the melting point of the salt, but below the melting point of the crystal and below the decomposition temperature of the salt thereby to diffuse atoms of the acceptor impurity from the salt into said crystal.

15. The method of producing an ohmic contact in a P-type germanium semiconductor starting crystal by diffusing atoms of an acceptor impurity into said crystal, said method including the steps of: bringing a salt having the acceptor impurity as one of its elements into contact with a portion of a surface of the germanium crystal; and heating the crystal-salt combination to a temperature above the melting point of the salt, but below the melting point of the crystal and below the decomposition temperature of the salt thereby to diffuse atoms of the acceptor impurity from the salt into said crystal.

16. The method of producing a junction in an N-type silicon semiconductor starting crystal by diffusing atoms of an acceptor impurity into said crystal, said method including the steps of: bringing an anhydrous sodium tetraborate salt into contact with a portion of a surface of the crystal; heating the crystal-salt combination to a temperature above the melting point of the salt, but below the melting point of the crystal and below the decomposition temperature of the salt for a period of time sufficient to permit atoms of boron from the salt to diffuse into the crystal.

References Cited in the file of this patent

UNITED STATES PATENTS

| | | |
|---|---|---|
| 2,697,269 | Fuller | Dec. 21, 1954 |
| 2,750,310 | Franke | June 12, 1956 |

U. S. DEPARTMENT OF COMMERCE

PATENT OFFICE

CERTIFICATE OF CORRECTION

Patent No. 2,828,232 March 25, 1958

Jon H. Myer

It is hereby certified that error appears in the printed specification of the above numbered patent requiring correction and that the said Letters Patent should read as corrected below.

Column 3, line 61, for "Fig.13" read -- Fig. 3 --; column 6, line 4, for "combination of" read -- combination for --; line 49, strike out "of", second occurrence.

Signed and sealed this 20th day of May 1958.

(SEAL)
Attest:
KARL H. AXLINE

Attesting Officer

ROBERT C. WATSON
Commissioner of Patents